United States Patent [19]
Townsend

[11] Patent Number: 5,597,318
[45] Date of Patent: Jan. 28, 1997

[54] ZIF FOR PLASTIC CHIP CARRIER

[75] Inventor: Peter K. Townsend, Camp Hill, Pa.

[73] Assignee: Berg Technology, Inc., Reno, Nev.

[21] Appl. No.: 275,959

[22] Filed: Jul. 15, 1994

[51] Int. Cl.⁶ ..................................................... H01R 4/50
[52] U.S. Cl. ........................................... 439/342; 439/259
[58] Field of Search .................................... 439/342, 347, 439/259, 405, 885; 29/845, 842

[56] References Cited

U.S. PATENT DOCUMENTS

| | | | |
|---|---|---|---|
| 3,795,889 | 3/1974 | Nauman et al. | 439/885 |
| 3,915,538 | 10/1975 | Gruhn, Jr. et al. | 439/342 |
| 4,082,399 | 4/1978 | Barkhuff | 439/259 |
| 4,202,595 | 5/1980 | Inouye et al. | 439/259 |
| 4,331,371 | 5/1982 | Ichimura et al. | 439/74 R |
| 4,375,309 | 3/1983 | Griffin | 439/75 M |
| 4,381,132 | 4/1983 | Tournier | 439/405 |
| 4,420,205 | 12/1983 | Kirkman | 439/74 R |
| 4,498,725 | 2/1985 | Bright et al. | 439/347 |
| 4,887,974 | 12/1989 | Ichimura et al. | 439/259 |
| 4,988,305 | 1/1991 | Svenkeson et al. | 439/65 |
| 4,988,310 | 1/1991 | Bright et al. | 439/259 |
| 5,002,499 | 3/1991 | Matsuoka | 439/342 |
| 5,256,080 | 10/1993 | Bright | 439/342 |
| 5,387,121 | 2/1995 | Kurz | 439/342 |

OTHER PUBLICATIONS

*ECN*; ZIF PGA Sockets Product Literature.

Primary Examiner—Gary F. Paumen
Assistant Examiner—T. C. Patel
Attorney, Agent, or Firm—Woodcock Washburn Kurtz Mackiewicz & Norris

[57] ABSTRACT

The present invention provides a pin grid array (PGA) socket for electrically connecting pins of an integrated circuit to a circuit substrate. The PGA socket according to the invention includes a cover having insertion holes arranged in rows and columns for receiving the pins of the integrated circuit and a base for supporting a plurality of deflectable contacts. The cover provides a buttress extending from each insertion hole. The contacts are preferably freely supported in the base and spaced on either about 0.5 inch centers or on about 0.1 inch centers. The centerlines of the insertion holes are correspondingly spaced approximately 0.5 inches or approximately 0.1 inches. The cover preferably provides a camming means. The cover can be slidably attached to the base to permit the cover to cam over the surface of the base. When the pins have been inserted through the insertion holes, the buttresses provide support for the pins of the integrated circuit as they are moved with the cover to interface with the contacts and while the interface between the contacts and the pins is maintained.

42 Claims, 5 Drawing Sheets

ZIF FOR PLASTIC CHIP CARRIER

FIELD OF THE INVENTION

The present invention relates to electrical connectors and, more particularly, to zero-insertion force pin grid array sockets for use in connecting an integrated circuit to a circuit substrate.

BACKGROUND OF THE INVENTION

Pin grid array (PGA) sockets are used for connecting an integrated circuit, such as an ASIC (application-specific integrated circuit), to a circuit substrate, such as a printed circuit board. PGA sockets typically comprise a base that supports a plurality of contacts and a cover with insertion holes. The base is mounted on the circuit substrate to form an electrical connection with circuits on the circuit substrate. The cover is attached to the base prior to assembly of the circuit substrate so that the lateral surfaces of the circuit substrate, base, and cover are stacked in a parallel arrangement.

When it is desired to connect an IC to the circuit substrate, the pins of the IC are forcibly inserted into the insertion holes of the cover and against the contacts to form an electrical connection therebetween. The insertion force required to establish an adequate electrical connection is considerable and can lead to difficulty in installing and removing the IC. Moreover, the pins of the IC may be easily damaged as a result of its installation and removal.

Therefore, low insertion force (LIF) and zero-insertion force (ZIF) PGA sockets have been developed to reduce the insertion forces needed to establish an electrical interface between the contacts and the pins. The covers of LIF or ZIF PGA sockets are typically attached to the base so that the cover is movable over the lateral surface of the base. A means for camming the cover over the surface of the base so that the contacts are deflected against the pins of the IC is provided. The base cover usually has contact support walls for supporting the individual contacts.

These LIF and ZIF devices, however, also can cause the pins of the ICs to be damaged. For example as the cover moves over the surface of the base, the pins are guillotined against the contacts and, as a result, can be broken or bent. Additionally, the mating force between the contact and the pin may damage the pin since the pins themselves are not provided with any support.

PGA socket covers have rows and columns of insertion holes. The exact number of insertion holes and the orientation of the insertion holes typically depends on the types of ICs to be connected to the circuit substrate. The rows and columns of insertion holes are spaced on 0.1-inch or 0.1-inch interstitial centers to accommodate the pin densities of most ICs available today. However, advancement in technology has resulted in the development of smaller or denser ICs with pins spaced on 0.05-inch centers.

Therefore, there is a need for a PGA socket that can be used to connect an IC to a circuit substrate without damaging the pins of the IC. Moreover, the PGA socket should be compatible with chips having pins spaced on either 0.1-inch or 0.05-inch centers.

SUMMARY OF THE INVENTION

This need is fulfilled by the present invention which provides a pin grid array socket for connecting an integrated circuit (IC) to a circuit substrate. The PGA socket according to the invention comprises a base for supporting a plurality of contacts, a cover having a plurality of insertion holes for receiving the plurality of pins and being slidably attached with the base so that the plurality of pins can be moved to form an electrical interface with the plurality of contacts, and a plurality of buttresses connected to the cover for supporting the plurality of pins. In a preferred embodiment, the insertion holes are arranged in rows and columns and the plurality of buttresses form rows coincident with one of the rows and columns of insertion holes. In an alternative embodiment, the insertion holes form an array of rows and columns where adjacent rows and adjacent columns are staggered, each insertion hole being individually connected to one of the plurality of buttresses.

A relief space between the plurality of contacts and the cover may preferably be provided when the base and the cover are attached to prevent burr formation from the contacts on the inner surface of the cover.

In a preferred embodiment, a camming means is operatively connected with the cover for camming the cover to slidably move relative to the base. In this preferred embodiment, the camming means is capable of slidably moving the cover no more than about 0.01 inches to cause the pins to form an electrical interface with the plurality of contacts.

The plurality of contacts may be supported in the base on about 0.1-inch centers or less. Alternatively, the plurality of contacts may be supported in the base on about 0.05-inch centers. A cover is selected with either (1) adjacent rows and adjacent columns of insertion holes spaced on about 0.05-inch centers; or (2) adjacent rows and adjacent columns of insertion holes spaced on about 0.1-inch centers.

The plurality of contacts may also be freely supported by the base and capable of deflecting about 0.01 inches in response to a normal force of at least about 100 grams in a preferred embodiment.

A method of assembling a pin grid array socket is also provided by the present invention. According to the inventive method, a plurality of contacts are stamped from a plate of conductive material. The plurality of contacts are then inserted into a base so that they are supported by the base. A cover having a plurality of insertion holes with buttresses extending therefrom is molded and then attached to the base so that the plurality of contacts and the buttresses are disposed between the base and the cover. A means for camming the cover with respect to the base is preferably connected to the cover before the cover is attached to the base.

In a preferred embodiment, the means for camming is capable of camming the cover about 0.01 inches with respect to the base. The cover is preferably attached to the base so that the cover is slidable in a direction substantially parallel to the base and over a lateral surface of the base.

In a more preferred embodiment, the plurality of contacts are stamped on about 0.05-inch centers, 0.1 inch interstitial centers, or 0.1 inch centers and supported in the base on their stamped centers. The plurality of insertion holes are correspondingly arranged in rows and columns such that the centerline of adjacent rows and the centerline of adjacent columns are separated by either about 0.1 inches or about 0.05 inches.

A method of using a pin grid array socket to interface an integrated circuit to a circuit substrate is also provided by the present invention. According to the method, a base supporting a plurality of contacts is connected to the circuit substrate. A cover with a camming means and a plurality of insertion holes with corresponding buttresses is attached to the base so that the plurality of contacts and the buttresses are disposed between the cover and the base. The pins of the integrated circuit may then be inserted through the insertion holes and the cover cammed to slidably move the pins into contact with the plurality of contacts to form an electrical interface therebetween. The buttresses provide support for the pins while the cover is cammed and while the electrical interface is maintained between the pins and the plurality of contacts.

BRIEF DESCRIPTION OF THE DRAWINGS

The present invention will be better understood, and its numerous objects and advantages will become apparent by reference to the following detailed description of the invention, when taken in conjunction with the following drawings, in which.

DETAILED DESCRIPTION OF THE INVENTION

Figure 1:
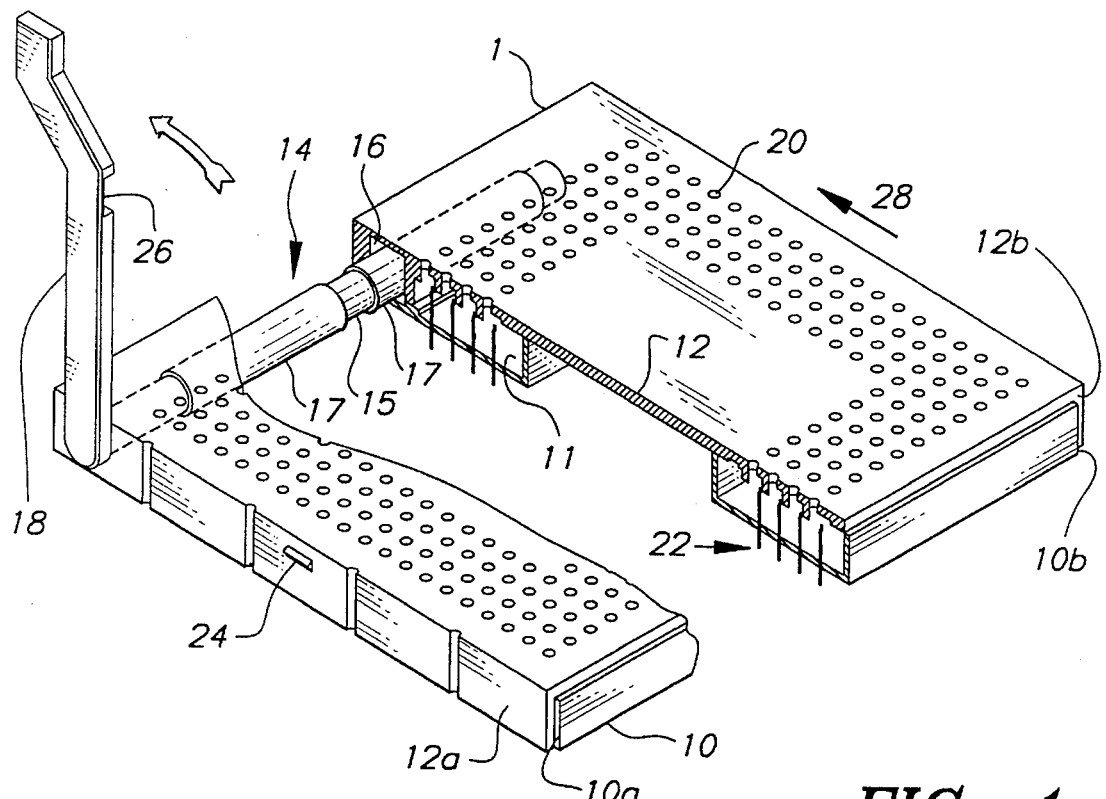
FIG. 1 shows a partial cross section of a PGA socket according to the invention.

FIG. 1 shows a partial cross section of a PGA socket 1 according to the invention. A base 10 and a cover 12 are shown attached together. The base and cover are preferably made of a plastic-like material, such as liquid crystal polymer, so that the walls 10a, 10b, of the base and the walls 12a, 12b of the cover are sufficiently flexible to permit the walls 12a and 12b to be snapped over ridges (not shown) of the corresponding walls 10a and 10b, respectively, to secure the cover to the base.

Figure 1A:
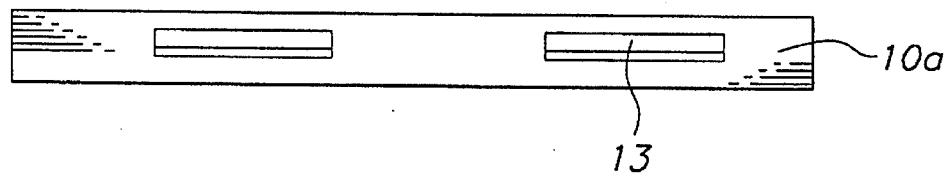
FIG. 1A shows an example of a wall of the base of a PGA socket according to the invention.
Figure 1B:
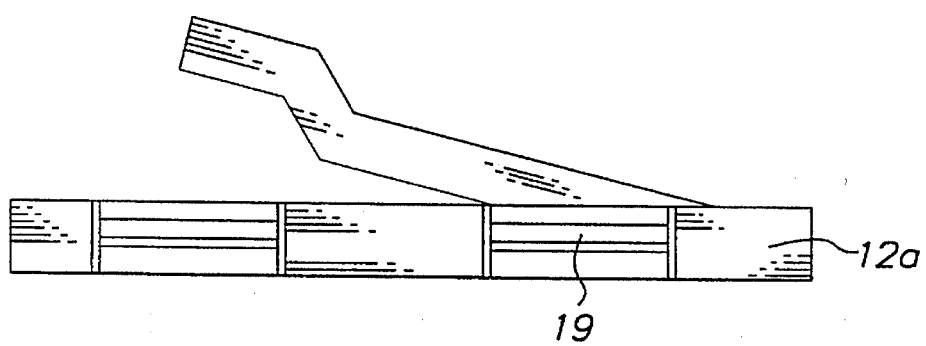
FIG. 1B shows an example of a wall of the cover of a PGA socket according to the invention.

FIG. 1A shows one example of the outer surface of wall 10a (10b) of the base 10. In this example, ridges 13 are formed on the surface of the wall. FIG. 1B shows the inner surface of wall 12a (12b) of a cover designed for use with the base shown in FIG. 1A. Wall 12a (12b) preferably provides slots 19 that are large enough to snap over ridges 13 and long enough to permit movement along ridges 13.

Referring back to FIG. 1, the base and cover cooperate to form an opening 16 through the PGA socket 1 in a plane perpendicular to the walls 10a, 10b, 12a, 12b. A cam 14 is disposed through the opening 16 and integrally connected to a cam bar 18. The cam bar 18 can be pivotally moved to cam the cover 12 over the lateral surface 11 of the base and along the walls 10a, 10b. A notch 26 and a latch 24 are preferably formed on the cam bar 18 and the wall 12a of the cover, respectively, for use in latching the cam bar 18 in place as explained below.

The cam 14 preferably comprises a bearing surface 15 and two camming surfaces 17. The bearing surface 15 and camming surfaces 17 are generally cylindrical. The larger diameter camming surfaces 17 are connected to each end of the bearing surface so that the center axis of the camming surfaces are coaligned but offset with respect to the center axis of the bearing surface so that a portion of the camming surfaces are flushed with a portion of the bearing surface and the remaining portions of the camming surfaces extend beyond the bearing surface as shown in the figure. Thus, when the cam bar 18 is lifted as shown, the camming surfaces are forced against the upper portion of the opening 16 in a counter clockwise direction. As a result, the cover is slidably moved over the lateral surface of the base in the direction shown by arrow 29. It should be understood that cam 14 can be configured in numerous ways to effect the necessary camming and that the cam shown in FIG. 1 is merely illustrative of an exemplary cam for camming the cover over the base.

Figure 2:
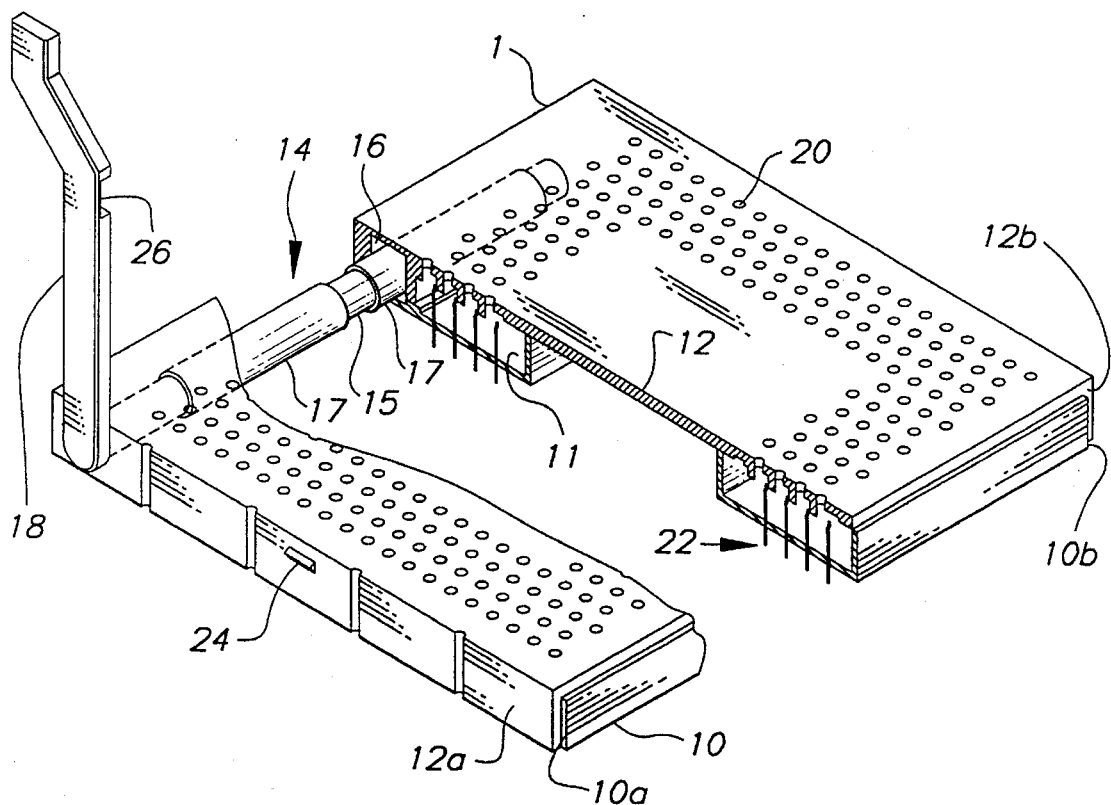
FIG. 2 shows an alternative embodiment of FIG. 1 in which the rows and columns of insertion holes are staggered.

A plurality of contacts 22 are supported in the base 10 as shown in FIG. 1. The top surface of the cover 12 provides a plurality of insertion holes 20. The insertion holes 20 are generally arranged in rows and columns as shown in FIG. 1. In an alternative embodiment shown in FIG. 2, the rows and columns of insertion holes may be staggered.

The insertion holes 20 should be dimensionally large enough to receive the pins of an IC without measurable insertion force. The plurality of contacts 22 are also preferably arranged in rows and columns so that each insertion hole corresponds to one contact. In some instances, there may be more contacts than insertion holes as is explained below.

Figure 3:
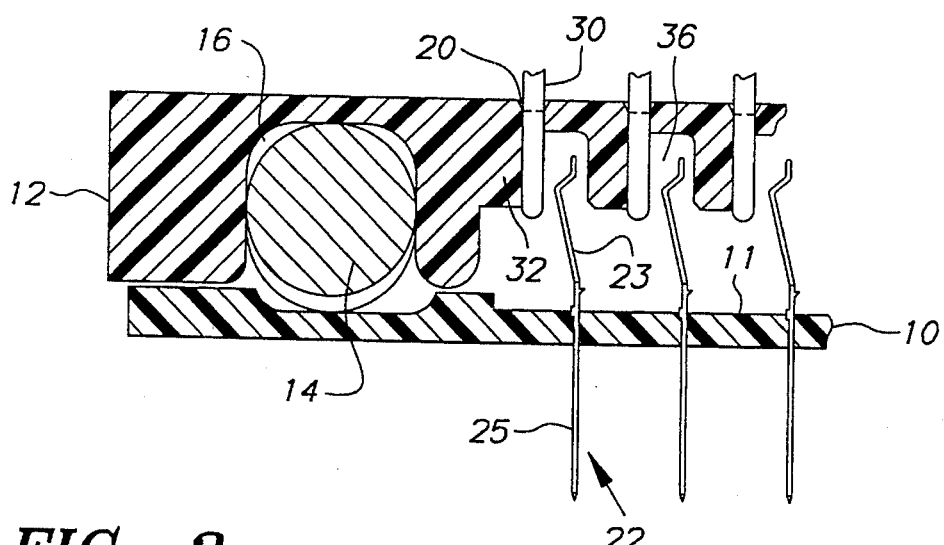
FIG. 3 is an enlarged cross section of a PGA socket according to the invention with the cam in an open position.

FIG. 3 is an enlarged cross section of a PGA socket according to the invention with the cam in an open position. The contacts 22 comprise a movable contact beam element 23 and a base member 25. When the cam bar 18 is lifted as shown in FIG. 1, the pins 30 of an IC can be inserted through insertion holes 20 without being forcibly pressed against the contacts beam elements 23. A buttress 32 integrally connected to the cover 12 extends downward from each of the insertion holes 20 toward the base 10. Each buttress 32 forms a means for supporting a pin received through the insertion hole 20 associated with the buttress.

Figure 4:
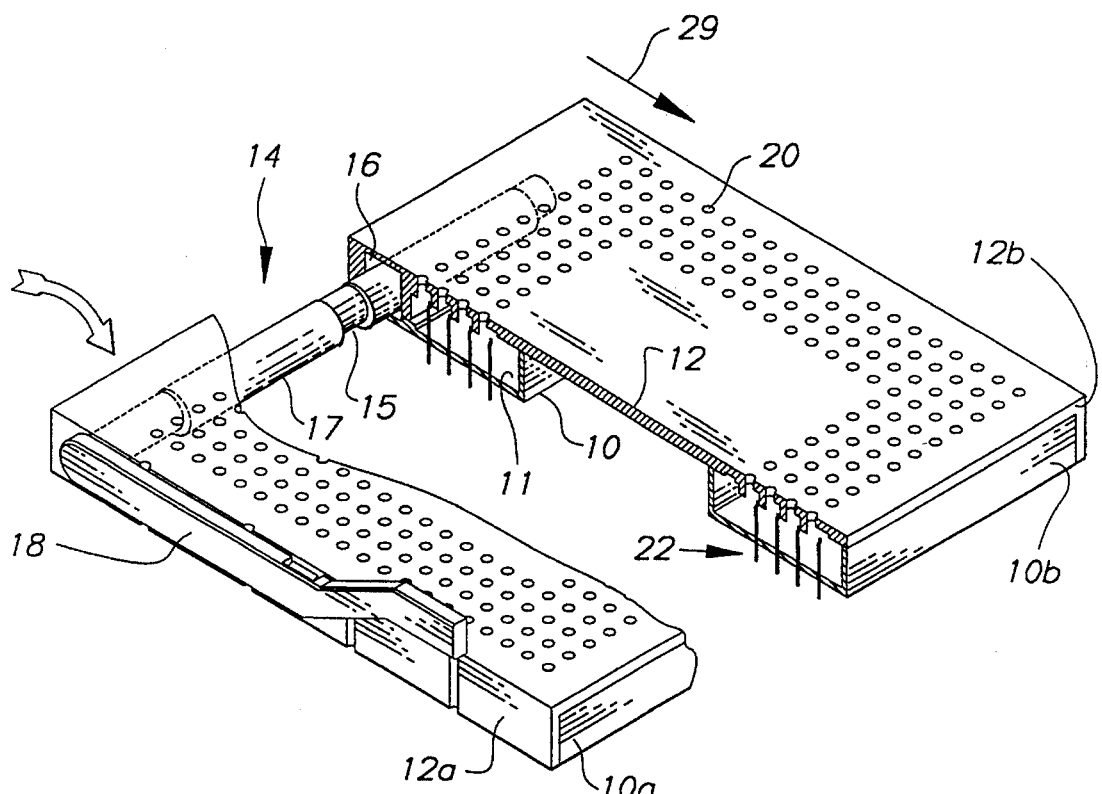
FIG. 4 shows the PGA socket of FIG. 1 with the cam bar latched in its closed position.
Figure 5:
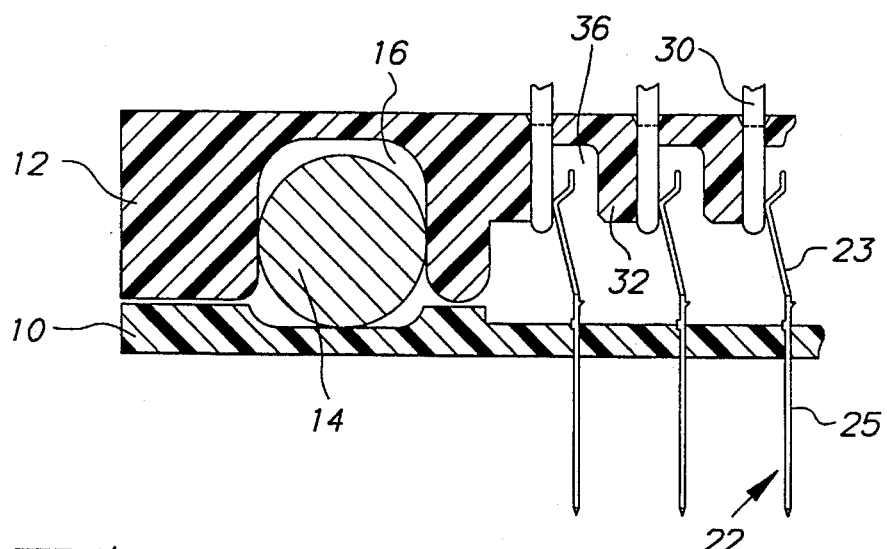
FIG. 5 shows an enlarged cross section of a PGA socket with the cam in the closed position.

FIG. 4 shows the PGA socket of FIG. 1 with the cam bar latched in its closed position and FIG. 5 shows an enlarged cross section of a PGA socket with the cam bar 18 in the closed position. When the cam bar 18 is pivoted from its open position to its closed position shown in FIG. 4, the camming surfaces 17 create a clockwise force against the opening 16 causing the cover 12 to slide along the base 10 in the direction of arrow 29. As the cover 12 moves with pins 30 inserted into the insertion holes 20, the buttresses 32 provide support for the pins. Without this support the pins are essentially guillotined against the contacts 22 causing the pins to break or bend as described above.

A relief space 36 (FIGS. 3 and 5) is preferably provided between the contact beam elements 23 and the cover 12. The purpose of the relief space is to prevent the contact beam elements from forming burrs in the cover as the cover is cammed to slide over the base. The addition of relief space 36 may also eliminate contact bending as the cover is cammed over the contacts.

The camming motion preferably provides enough movement of the cover to bring each of the pins 30 into contact with a respective contact beam member 23 with sufficient force to establish a stable electrical interface between each pin 30 and a respective contact 22. In a preferred embodiment, the contact beam element 23 may be deflected by a pin so that the normal force exceeds about 70 grams. According to this preferred embodiment, the cover is moved about 0.01 inches by the cam to produce a normal force of at least about 70 grams.

In a preferred embodiment, the contacts 22 are freely supported by the base as shown in FIGS. 3 and 5. Each contact is preferably about 0.005 inches thick and made of beryllium copper. In this preferred embodiment, the contact beam element has a working length of approximately 0.110 inches. When tolerances drive the contact beam beyond 0.01 inches it does not yield but rather allows the normal force to exceed about 100 grams.

Standard ICs typically provide pins that are spaced on 0.1-inch centers. Thus, most PGA sockets provide insertion holes spaced on 0.1-inch centers with respective contact beam elements supported in the base on 0.1-inch centers. As technology progresses, pin densities become greater and chips become smaller. It is expected that many ICs will provide pins that are spaced on 0.05-inch centers. Thus, in a preferred embodiment, the contacts are preferably stamped on 0.05-inch centers from a plate of conductive material.

Figure 6:
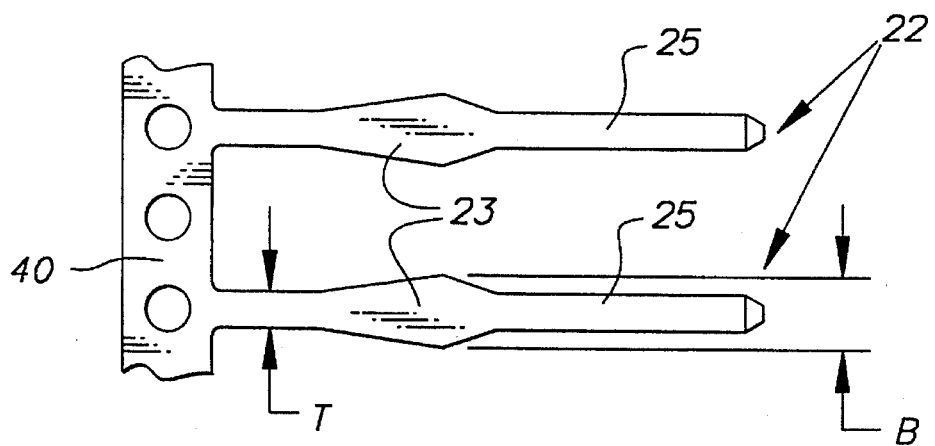
FIG. 6 shows a contact strip stamped in accordance with the present invention.

FIG. 6 shows a contact strip stamped in accordance with a preferred embodiment of the invention. The resulting contact strip contains a plurality of contacts 22 connected together by a carrier strip 40. The contact beam element 23 has a trapezoidal design with its base B having a thickness T of about 0.04 inches and its top having a thickness of about 0.02 inches. During the stamping process, the contacts are preferably shaped as shown in FIGS. 3 and 5. The plurality of contacts may then be inserted into the base so that the contacts are supported therein on 0.05-inch centers. As a result of the contact beam design, there is no need to produce a base with means for supporting the contacts.

A cover according to the invention provides insertion holes spaced on either 0.1-inch centers, 0.1-inch interstitial centers or 0.05-inch centers depending upon the types of ICs to be connected to the circuit substrate. A base with contacts spaced on 0.1-inch centers, 0.1-inch interstitial centers or 0.05-inch centers may then be mated with appropriate cover. The cam preferably remains substantially identical regardless of the cover used.

Figure 7A:
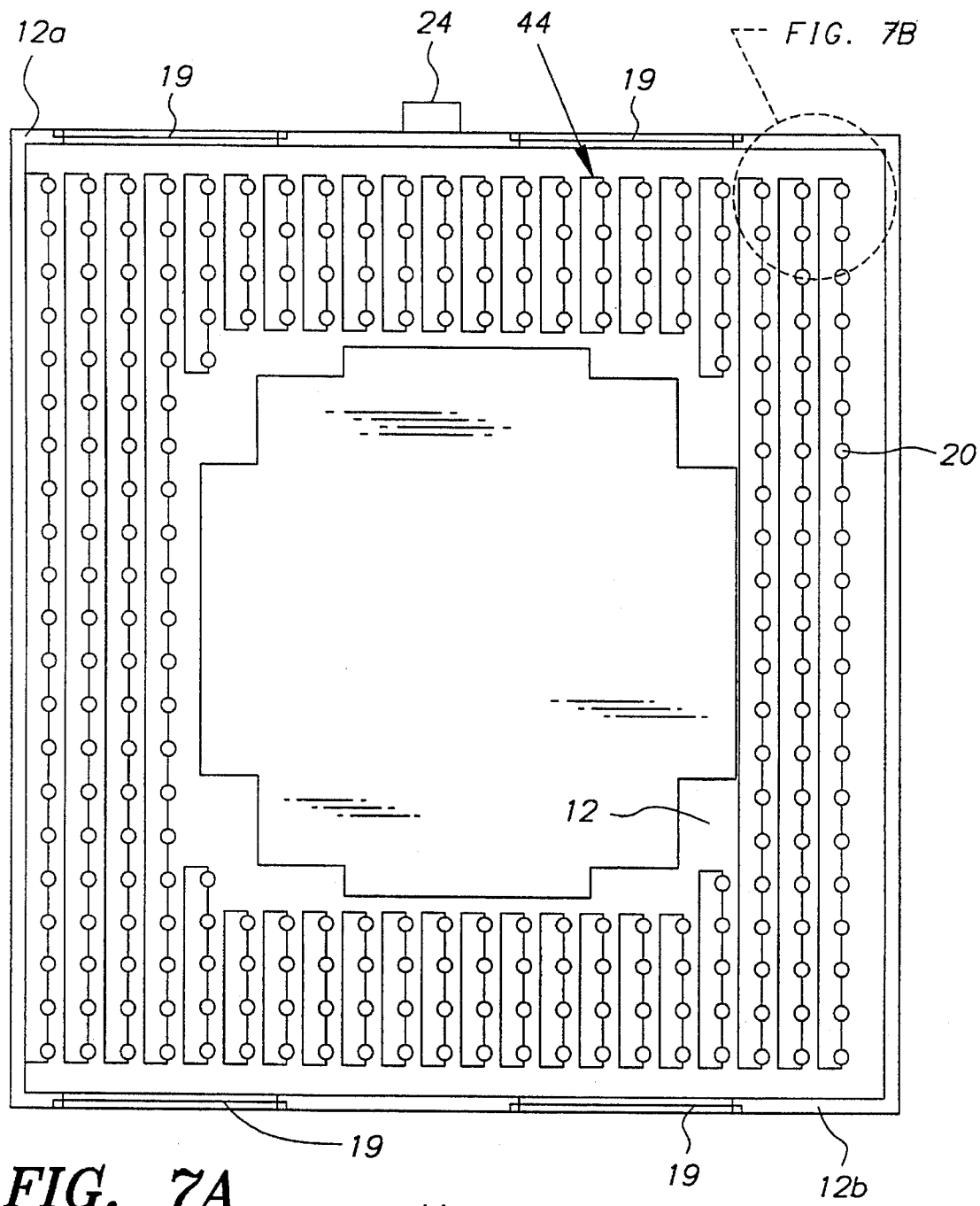
FIG. 7A shows the underside of a PGA socket cover having buttress strips according to a preferred embodiment of the invention.
Figure 7B:
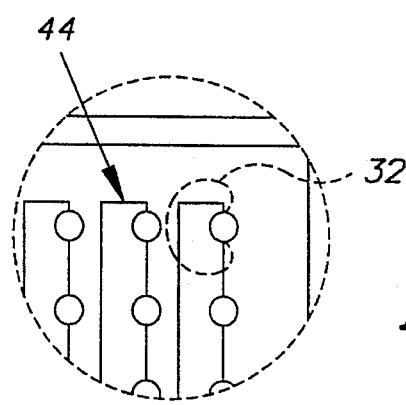
FIG. 7B shows an enlarged view of the portion of FIG. 7A shown within the dashed lines.

In a preferred embodiment, pin support buttresses are provided as strips running the length of each row or each column of insertion holes so that a portion of the strip extends from each insertion hole forming an individual buttress associated with each insertion hole. FIGS. 7A and 7B show the underside of a cover in which buttress strips 44 are formed. Individual buttresses 32 are indicated, for example, within the dashed lines. Thus, a portion of each buttress strip 44 extends from an associated insertion hole 20 to form the buttresses 32. As shown in FIGS. 7A and 7B, each buttress 32 is coextensive with its associated insertion hole such that the buttress forms an arcuate wall support for a pin.

In a cover with insertion holes spaced on 0.1-inch centers, the buttress strip is preferably about 0.040 inches thick and extends downward from the cover about 0.100 inches. The thickness of the buttress may be reduced to about 0.010 inches to accommodate the closer spacing of covers with insertion holes spaced on 0.05-inch centers. In a PGA socket cover having its rows and columns of insertion holes in the staggered arrangement shown in FIG. 2, the buttresses are individually molded onto the cover with the same dimensions as set forth above.

To produce a PGA socket according to the invention, a plurality of contacts connected to a detachable carrier strip are stamped from a plate of conductive material such as beryllium copper. The plurality of contacts are preferably stamped on 0.05-inch centers with the dimensions and shape described above. A base is preferably molded with insertion holes for supporting the contacts spaced on 0.05-inch centers. The contacts may then be inserted through respective insertion holes in the base. The detachable carrier strip is then preferably detached from the plurality of contacts so that the base is left supporting a plurality of contact beam elements. The base members of the contacts extend through the insertion holes of the base and can be used as through mounts for mounting the base onto a circuit substrate.

A cover having insertion holes with buttresses extending therefrom and a cam mechanism may also be molded from a plastic-like material. The cam mechanism is then operably connected to the cover. The cover is snapped onto the base as described above.

Since, the base does not require contact support walls, it is possible to reduce the spacing of the contacts supported in the base. Therefore, PGA sockets according to the invention are adaptable for use with ICs having pins spaced on 0.05-inch centers. Moreover, the elimination of the contact support walls allows the base to more be easily produced than previously.

In use the cam bar is lifted to its open position before connecting an IC to a circuit substrate. The pins of an IC are placed within the insertion holes of the cover. The cam bar is then lowered to its closed position. As the cam bar is lowered the cover is cammed to move the pins into contact with corresponding contact beam elements. The pins are thus supported by the buttresses while the cover is in motion. Once the cam bar is in its closed position, it is preferably latched into place. The cam bar is preferably sufficiently flexible to permit the cam bar to be pressed down over latch 24 (FIGS. 1 and 4). Ridge 26 (FIG. 4) provides a means for guiding the cam bar over latch 24. In the closed position, the pins cause the contact beam elements to deflect, thereby exerting a normal force on the pins to create a stable electrical interface therebetween. The contact beam elements may be deflected up to about 0.01 inches so that the pins are subjected to the normal force of at least about 70 grams. Therefore, the buttresses provide additional pin support while the PGA socket is closed.

To remove the IC, the cam bar is lifted to its open position. As a result, the cover is slidably moved along the lateral surface of the base so that the pins are moved in a direction away from the contacts to break the electrical interface therebetween. Once, the cam bar is in the open position the pins of the IC may be retracted from the PGA socket.

While the invention has been described and illustrated with reference to specific embodiments, those skilled in the art will recognize that modification and variations may be made without departing from the principles of the invention as described hereinabove and set forth in the following claims.

What is claimed:

1. A pin grid array socket for connecting an integrated circuit (IC) having a plurality of pins to a circuit substrate, comprising:

a base for supporting a plurality of contacts which extend through the base to electrically connect to the circuit substrate;

a cover having a plurality of insertion holes for receiving said plurality of pins and being slidably attached with said base so that said plurality of pins can be moved to form an electrical interface with said plurality of contacts; and a plurality of buttresses having an arcuate surface thereof connected to said cover for supporting said plurality of pins,t he arcuate surface of each buttress engaging a respective pin to provide support over a substantial length of the pin.

2. The socket of claim 1, wherein the insertion holes are arranged in rows and columns and said plurality of buttresses form rows coincident with one of the rows and columns of insertion holes.

3. The socket of claim 1, wherein the insertion holes form an array of rows and columns where adjacent rows and adjacent columns are staggered, each insertion hole being individually connected to one of said plurality of buttresses.

4. The socket of claim 1, wherein a relief space between said plurality of contacts and said cover is provided when said base and said cover are attached.

5. The socket of claim 1, wherein said plurality of contacts are supported in said base on about 0.1-inch centers or less.

6. The socket of claim 1, wherein said plurality of contacts are supported in said base on about 0.05-inch centers.

7. The socket of claim 1, wherein the insertion holes are arranged in rows and columns to form an array of insertion holes on said cover, said cover being attached to said base having one of:
(1) adjacent rows and adjacent columns of insertion holes spaced on about 0.05-inch centers; or
(2) adjacent rows and adjacent columns of insertion holes spaced on about 0.1-inch centers.

8. The socket of claim 1, wherein said plurality of contacts are freely supported by said base and are capable of deflecting about 0.01 inches in response to a normal force of at least about 100 grams.

9. The socket of claim 1, further comprising:
a camming means operatively connected with said cover for camming said cover to slidably move relative to said base.

10. The socket of claim 9, wherein said camming means is capable of slidably moving said cover no more than about 0.01 inches to cause said pins to form an electrical interface with said plurality of contacts.

11. A method of assembling a pin grid array socket, comprising the steps of:
stamping a plurality of contacts from a plate of conductive material;
supporting said plurality of contacts into a base so that one end of each contact extends through the base forming a base member for directly electrically connecting with a circuit substrate and the other end forming a contact beam element;
molding a cover having a plurality of insertion holes with buttresses extending therefrom, each buttress having an arcuate surface for supporting a pin over a substantial length of the pin; and
attaching said cover to said base so that said contact beam elements of said plurality of contacts and said buttresses are disposed between said base and said cover.

12. The method of claim 11, wherein said cover is attached to said base so that said cover is slidable in a direction substantially parallel to said base and over a lateral surface of said base.

13. The method of claim 11, wherein said plurality of contacts are stamped on about 0.05-inch centers and supported in said base on their stamped centers.

14. The method of claim 11, wherein said plurality of insertion holes are arranged in rows and columns such that the centerlines of adjacent rows and the centerlines of adjacent columns are separated by one of 0.1 inches or 0.05 inches.

15. The method of claim 11, further comprising the step of:
providing a means for camming said cover with respect to said base; and
operatively connecting said means for camming to said cover before said cover is attached to said base.

16. The method of claim 15, wherein said means for camming is capable of camming said cover about 0.01 inches with respect to said base.

17. A method of using a pin grid array socket to interface an integrated circuit to a circuit substrate, comprising the steps of:
connecting a base supporting a plurality of contacts which extend completely through the base to said circuit substrate so that said plurality of contacts are electrically connected with said circuit substrate;
attaching a cover with a camming means and a plurality of insertion holes with corresponding buttresses to said base so that said plurality of contacts and said buttresses are disposed between said cover and said base, each buttress having an arcuate surface;
inserting the pins of said integrated circuit through the insertion holes so that each pin is engaged by the arcuate surface of a respective buttress over a substantial length of the pin; and
camming said cover to slidably move the pins into contact with said plurality of contacts to form an electrical interface therebetween, said arcuate surfaces providing support for the pins while the cover is cammed and while the electrical interface is maintained between the pins and said plurality of contacts.

18. The method of claim 17, wherein the plurality of contacts are deflected up to 0.01 inches in response to a normal force of at least about 70 grams.

19. The method of claim 17, wherein said plurality of contacts are supported in said base on 0.05-inch centers and wherein said insertion holes are arranged in an array of rows and columns on said cover, the method further comprising the step of:
selecting one of (1) a first cover having the center lines of adjacent rows and adjacent columns separated by about 0.1 inches, and (2) a second cover having the center lines of adjacent rows and adjacent columns separated by about 0.05 inches, wherein said selected cover is attached to said base.

20. The method of claim 17, wherein a camming means comprising a cam bar and a cam is connected to the cover, the method further comprising the steps of:
lifting said cam bar to open said pin grid array socket before inserting the pins of the integrated circuit; and
lowering said cam bar to close said pin grid array socket thereby camming said cover to move the pins into contact with said plurality of contacts.

21. The method of claim 20, further comprising the step of:
latching said cam bar in place after closing said pin grid array socket.

22. A pin grid array socket for connecting an integrated circuit (IC) having a plurality of pins to a circuit substrate, comprising:

a base having two opposite-facing substantially flat surfaces for securing a plurality of contacts, said contacts extending through both surfaces of the base and electrically connecting with the circuit substrate;

a cover having a plurality of insertion holes for receiving said plurality of pins and being slidably attached with said base so that a portion of each of said plurality of contacts is disposed between said base and said cover and so that said plurality of pins can be moved to form an electrical interface with said portions of said plurality of contacts; and a plurality of buttresses connected to said cover for supporting said plurality of pins, said portion of each of the plurality of contacts disposed between said base and said cover being unsupported.

23. The socket of claim 22, wherein the insertion holes are arranged in rows and columns and said plurality of buttresses form rows coincident with one of the rows and columns of insertion holes.

24. The socket of claim 22, wherein the insertion holes form an array of rows and columns where adjacent rows and adjacent columns are staggered, each insertion hole being individually connected to one of said plurality of buttresses.

25. The socket of claim 22, wherein a relief space between said plurality of contacts and said cover is provided when said base and said cover are attached.

26. The socket of claim 22, wherein said plurality of contacts are secured in said base on about 0.1-inch centers or less.

27. The socket of claim 22, wherein said plurality of contacts are secured in said base on about 0.05-inch centers.

28. The socket of claim 22, wherein the insertion holes are arranged in rows and columns to form an array of insertion holes on said cover, said cover being attached to said base having one of:

(1) adjacent rows and adjacent columns of insertion holes spaced on about 0.05-inch centers; or (2) adjacent rows and adjacent columns of insertion holes spaced on about 0.1-inch centers.

29. The socket of claim 22, wherein said plurality of contacts are capable of deflecting about 0.01 inches in response to a normal force of at least about 100 grams.

30. The socket of claim 22, further comprising:

a camming means operatively connected with said cover for camming said cover to slidably move relative to said base.

31. The socket of claim 30, wherein said camming means is capable of slidably moving said cover no more than about 0.01 inches to cause said pins to form an electrical interface with said plurality of contacts.

32. A method of assembling a pin grid array socket, comprising the steps of:

stamping a plurality of contacts from a plate of conductive material;

securing said plurality of contacts into a base having two opposite-facing substantially flat surfaces so that the contacts extend through both of said surfaces;

molding a cover having a plurality of insertion holes with buttresses extending therefrom; and attaching said cover to said base so that said plurality of contacts and said buttresses are disposed between said base and said cover, said plurality of contacts disposed between said cover and said base being unsupported.

33. The method of claim 32, wherein said cover is attached to said base so that said cover is slidable in a direction substantially parallel to said base and over one of the surfaces of said base.

34. The method of claim 32, wherein said plurality of contacts are stamped on about 0.05-inch centers and secured in said base on their stamped centers.

35. The method of claim 32, wherein said plurality of insertion holes are arranged in rows and columns such that the centerlines of adjacent rows and the centerlines of adjacent columns are separated by one of 0.1 inches or 0.05 inches.

36. The method of claim 32, further comprising the step of:

providing a means for camming said cover with respect to said base; and operatively connecting said means for camming to said cover before said cover is attached to said base.

37. The method of claim 36, wherein said means for camming is capable of camming said cover about 0.01 inches with respect to said base.

38. A method of using a pin grid array socket to interface an integrated circuit to a circuit substrate, comprising the steps of:

connecting a base in which a plurality of contacts are secured to said circuit substrate so that said plurality of contacts form an electrical connection with said circuit substrate, said base having two opposite-facing substantially flat surfaces from which said plurality of contacts extend;

attaching a cover with a camming means and a plurality of insertion holes with corresponding buttresses to said base so that at least a portion of each of said plurality of contacts and said buttresses are disposed between said cover and said base;

inserting the pins of said integrated circuit through the insertion holes; and camming said cover to slidably move the pins into contact with said plurality of contacts to form an electrical interface therebetween, said buttresses providing support for the pins while the cover is cammed and while the electrical interface is maintained between the pins and said plurality of contacts, said portion of each of said plurality of contacts disposed between said cover and said base unsupported.

39. The method of claim 38, wherein the plurality of contacts are deflected up to 0.01 inches in response to a normal force of at least about 70 grams.

40. The method of claim 38, wherein said plurality of contacts are secured in said base on 0.05-inch centers and wherein said insertion holes are arranged in an array of rows and columns on said cover, the method further comprising the step of:

selecting one of (1) a first cover having the center lines of adjacent rows and adjacent columns separated by about 0.1 inches, and (2) a second cover having the center lines of adjacent rows and adjacent columns separated by about 0.05 inches, wherein said selected cover is attached to said base.

41. The method of claim 38, wherein a camming means comprising a cam bar and a cam is connected to the cover, the method further comprising the steps of:

lifting said cam bar to open said pin grid array socket before inserting the pins of the integrated circuit; and lowering said cam bar to close said pin grid array socket thereby camming said cover to move the pins into contact with said plurality of contacts.

42. The method of claim 41, further comprising the step of:

latching said cam bar in place after closing said pin grid array socket.

* * * * *

UNITED STATES PATENT AND TRADEMARK OFFICE
CERTIFICATE OF CORRECTION

PATENT NO. : 5,597,318

DATED : January 28, 1997

INVENTOR(S) : Peter K. Townsend

It is certified that error appears in the above-indentified patent and that said Letters Patent is hereby corrected as shown below:

Column 4, Line 19 - "29" should be "28".

Column 5, Line 34 - "T" should be deleted.

Column 5, Line 34 - A "T" should be inserted after the word "top".

Column 5, Line 45 - The word "an" should be typed before the word "appropriate".

Column 6, Line 29 - The word "more" should be deleted.

Column 6, Line 30 - The words "than previously" should be deleted.

Column 6, Line 40 - "FIG. 4" should be deleted.

Column 6, Line 41 - After "24", "(Figures 1 and 4)" should be inserted.

UNITED STATES PATENT AND TRADEMARK OFFICE
CERTIFICATE OF CORRECTION

PATENT NO. : 5,597,318
DATED : January 28, 1997
INVENTOR(S) : Peter K. Townsend

It is certified that error appears in the above-indentified patent and that said Letters Patent is hereby corrected as shown below:

Column 7, Line 8 — "pins,t he" should be deleted and the words -- pins, the -- inserted.

Signed and Sealed this

Twenty-seventh Day of May, 1997

Attest:

BRUCE LEHMAN

Attesting Officer

Commissioner of Patents and Trademarks